US008957744B2

(12) United States Patent
Yoshino et al.

(10) Patent No.: US 8,957,744 B2
(45) Date of Patent: Feb. 17, 2015

(54) MULTILAYER COMMON MODE FILTER

(71) Applicant: TDK Corporation, Tokyo (JP)

(72) Inventors: Makoto Yoshino, Tokyo (JP); Takuo Hattori, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 14/132,731

(22) Filed: Dec. 18, 2013

(65) Prior Publication Data

US 2014/0191824 A1    Jul. 10, 2014

(30) Foreign Application Priority Data

Jan. 9, 2013   (JP) ................. 2013-001946

(51) Int. Cl.
| | | |
|---|---|---|
| *H03H 7/00* | (2006.01) | |
| *H03H 7/42* | (2006.01) | |
| *H03H 1/00* | (2006.01) | |

(52) U.S. Cl.
CPC ....... *H03H 7/427* (2013.01); *H03H 2001/0085* (2013.01)
USPC .......................................... 333/185; 336/200

(58) Field of Classification Search
CPC .. H03H 7/09; H03H 7/427; H03H 2001/0085
USPC ............. 333/181, 185; 336/200, 232
See application file for complete search history.

(56) References Cited

U.S. PATENT DOCUMENTS

| 6,710,694 B2 * | 3/2004 | Matsuta et al. ............ 336/200 |
| 8,466,757 B2 * | 6/2013 | Yoshino et al. ............ 333/185 |
| 2003/0193386 A1 * | 10/2003 | Tseng et al. .............. 336/200 |
| 2013/0229253 A1 * | 9/2013 | Inui et al. ................ 336/200 |
| 2013/0234819 A1 * | 9/2013 | Yoo et al. ................ 336/200 |

FOREIGN PATENT DOCUMENTS

| JP | A-2002-373810 | 12/2002 |
| JP | A-2012-124470 | 6/2012 |

* cited by examiner

*Primary Examiner* — Patrick O'Neill
(74) *Attorney, Agent, or Firm* — Oliff PLC

(57) ABSTRACT

A first coil is configured in such a structure that first and second coil conductors are connected by a first through-hole conductor. A second coil is configured in such a structure that third and fourth coil conductors are connected by a second through-hole conductor. The first and second coils are arranged in a nonmagnetic section consisting of nonmagnetic layers. A portion located inside the first coil and the second coil in the nonmagnetic section includes a first regional portion and a second regional portion adjacent to each other when viewed from a laminated direction of the nonmagnetic layers. The first and second through-hole conductors are located in the first regional portion so as to be adjacent to each other, when viewed from the laminated direction. A magnetic core section comprised of a magnetic material is located in the second regional portion when viewed from the laminated direction.

4 Claims, 7 Drawing Sheets

MULTILAYER COMMON MODE FILTER

BACKGROUND OF THE INVENTION

1. Field of the Invention

The present invention relates to a multilayer common mode filter.

2. Related Background Art

There is a known multilayer common mode filter provided with an element body having a nonmagnetic section in which a plurality of nonmagnetic layers are laminated together, a first coil, a second coil, and a magnetic core section made of a magnetic material (e.g., cf. Japanese Patent Application Laid-Open Publication No. 2012-124470). Each of the first coil and the second coil is composed of a pair of coil conductors of a spiral shape connected by a through-hole conductor. The magnetic core section is arranged in the nonmagnetic section so as to be located inside the first and second coils when viewed from a laminated direction of the nonmagnetic layers.

SUMMARY OF THE INVENTION

However, the multilayer common mode filter described in the foregoing Laid-Open Publication No. 2012-124470 may have the problem as described below. Since the through-hole conductor in the first coil and the through-hole conductor in the second coil are arranged with the magnetic core section in between, the through-hole conductor in the first coil and the through-hole conductor in the second coil are located apart from each other. As a consequence of this arrangement, the through-hole conductors are less likely to be magnetically coupled to each other. Therefore, there is a possibility of reduction in magnetic coupling between the first coil and the second coil.

An object of the present invention is to provide a multilayer common mode filter capable of enhancing the magnetic coupling between the first coil and the second coil.

A multilayer common mode filter according to the present invention is one comprising: an element body having a nonmagnetic section in which a plurality of nonmagnetic layers are laminated together; a first coil having first and second coil conductors of a spiral shape and configured in such a structure that the first coil conductor and the second coil conductor are connected by a first through-hole conductor; a second coil having third and fourth coil conductors of a spiral shape and configured in such a structure that the third coil conductor and the fourth coil conductor are connected by a second through-hole conductor; and a magnetic core section arranged in the nonmagnetic section so as to be located inside the first coil and the second coil when viewed from a laminated direction of the plurality of nonmagnetic layers, and comprised of a magnetic material, wherein the first coil and the second coil are arranged in the nonmagnetic section so that the first coil conductor and the third coil conductor are adjacent to each other in the laminated direction and so that the second coil conductor and the fourth coil conductor are adjacent to each other in the laminated direction, wherein a portion located inside the first coil and the second coil in the nonmagnetic section includes a first regional portion and a second regional portion adjacent to each other when viewed from the laminated direction, wherein the first through-hole conductor and the second through-hole conductor are located in the first regional portion so as to be adjacent to each other, when viewed from the laminated direction, and wherein the magnetic core section is located in the second regional portion when viewed from the laminated direction.

In the multilayer common mode filter according to the present invention, the portion located inside the first coil and the second coil in the nonmagnetic section includes the first regional portion and the second regional portion adjacent to each other when viewed from the laminated direction. When viewed from the laminated direction, the first through-hole conductor and the second through-hole conductor are located in the first regional portion so as to be adjacent to each other. The magnetic core section is located in the second regional portion. As a consequence of these, the distance between the first through-hole conductor and the second through-hole conductor is short and thus the first through-hole conductor and the second through-hole conductor are easy to be magnetically coupled. Therefore, the present invention successfully enhances the magnetic coupling between the first coil and the second coil.

The multilayer common mode filter may be configured as follows: the element body has a substantially rectangular parallelepiped shape; the portion located inside the first coil and the second coil in the nonmagnetic section has a shape elongated in a longitudinal direction of the element body when viewed from the laminated direction; the first through-hole conductor and the second through-hole conductor are located so as to be lined up along the longitudinal direction, when viewed from the laminated direction. In this case, the first through-hole conductor and the second through-hole conductor can be readily arranged close together, while preventing a short circuit between each through-hole conductor and each coil conductor. As a consequence of this, it is feasible to further enhance the magnetic coupling between the first coil and the second coil.

The element body may further have a pair of magnetic sections comprised of a magnetic material and arranged with the nonmagnetic section in between in the laminated direction. In this case, it is feasible to further enhance the magnetic coupling between the first coil and the second coil.

The first coil and the second coil may be arranged in the nonmagnetic section further so that the second coil conductor and the third coil conductor are adjacent to each other in the laminated direction. In this case, the magnetic coupling is achieved not only between the first coil conductor and the third coil conductor and between the second coil conductor and the fourth coil conductor, but also between the second coil conductor and the third coil conductor. As a consequence of this, it is feasible to further enhance the magnetic coupling between the first coil and the second coil.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. In the description the same elements or elements with the same functionality will be denoted by the same reference signs, without redundant description.

Figure 1:
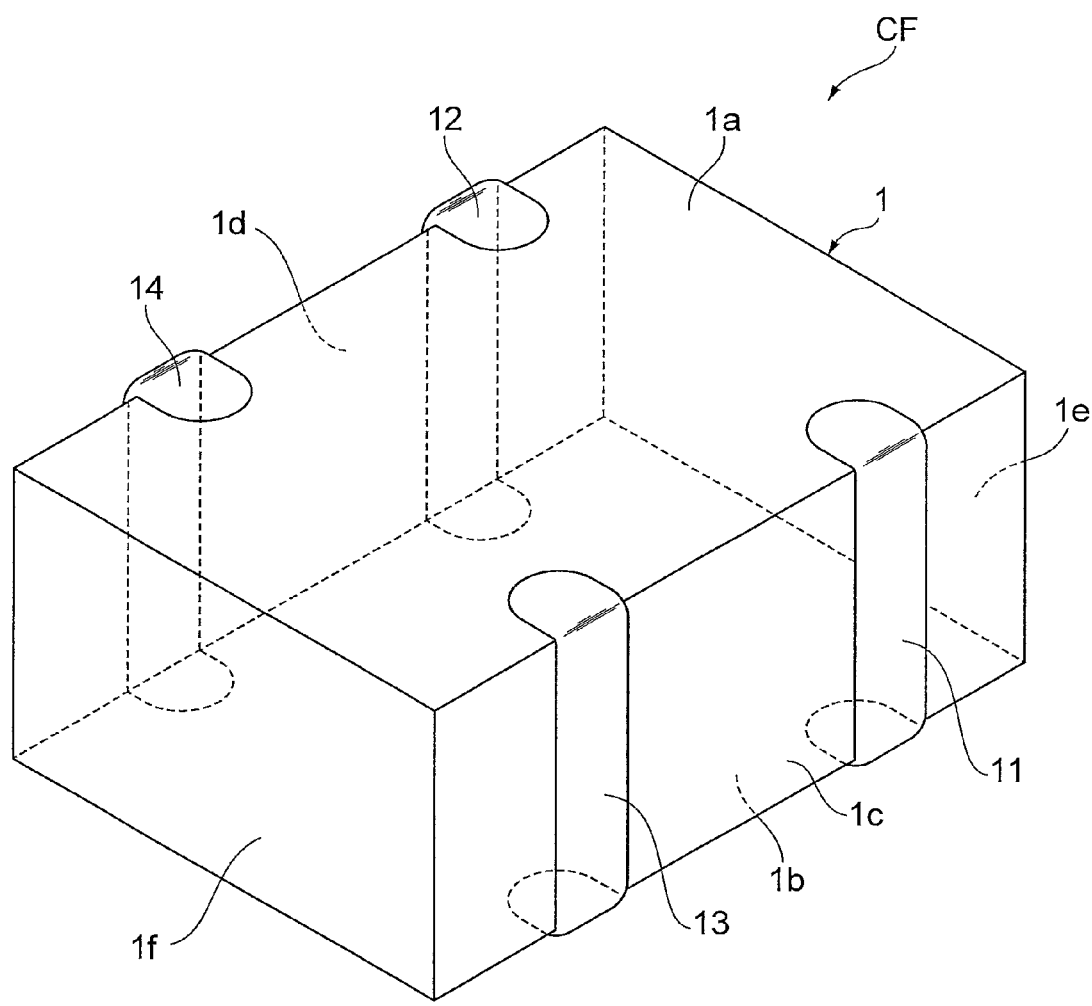
FIG. 1 is a perspective view showing a multilayer common mode filter according to an embodiment of the present invention.
Figure 2:
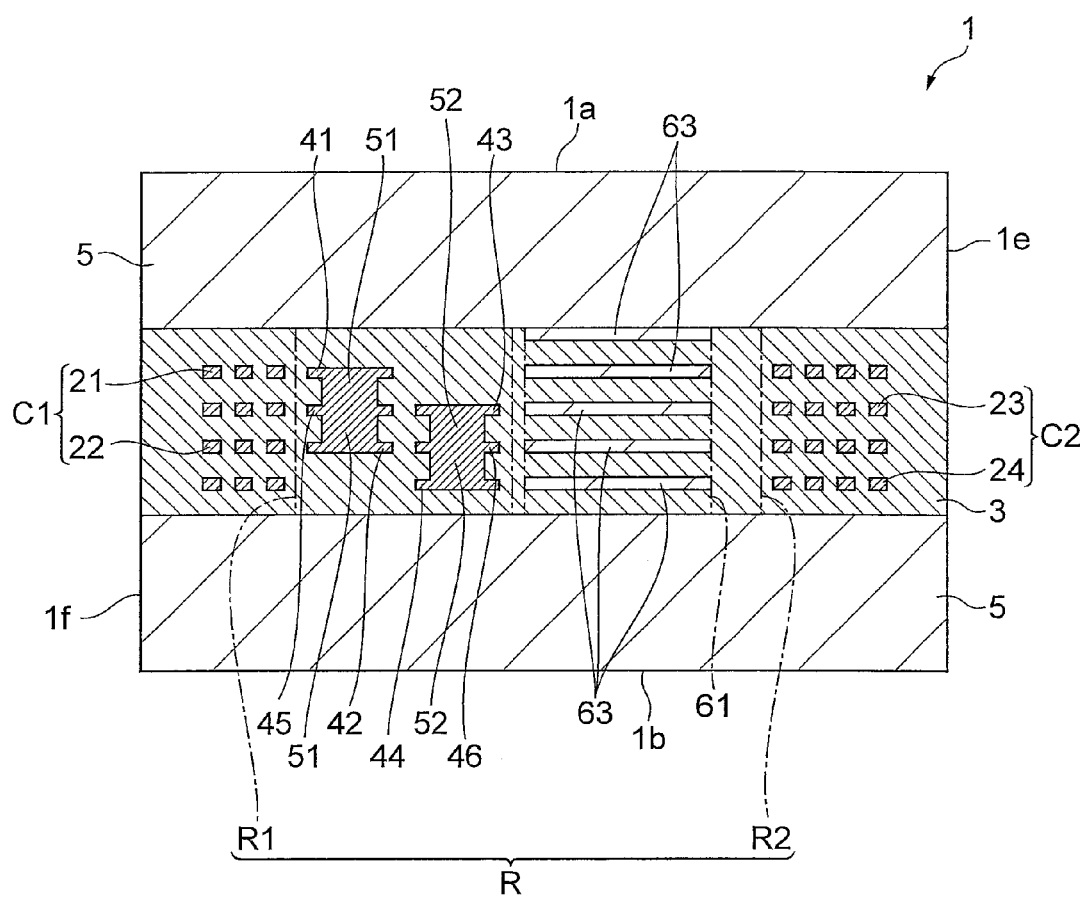
FIG. 2 is a drawing for explaining a cross-sectional configuration of an element body.
Figure 3:
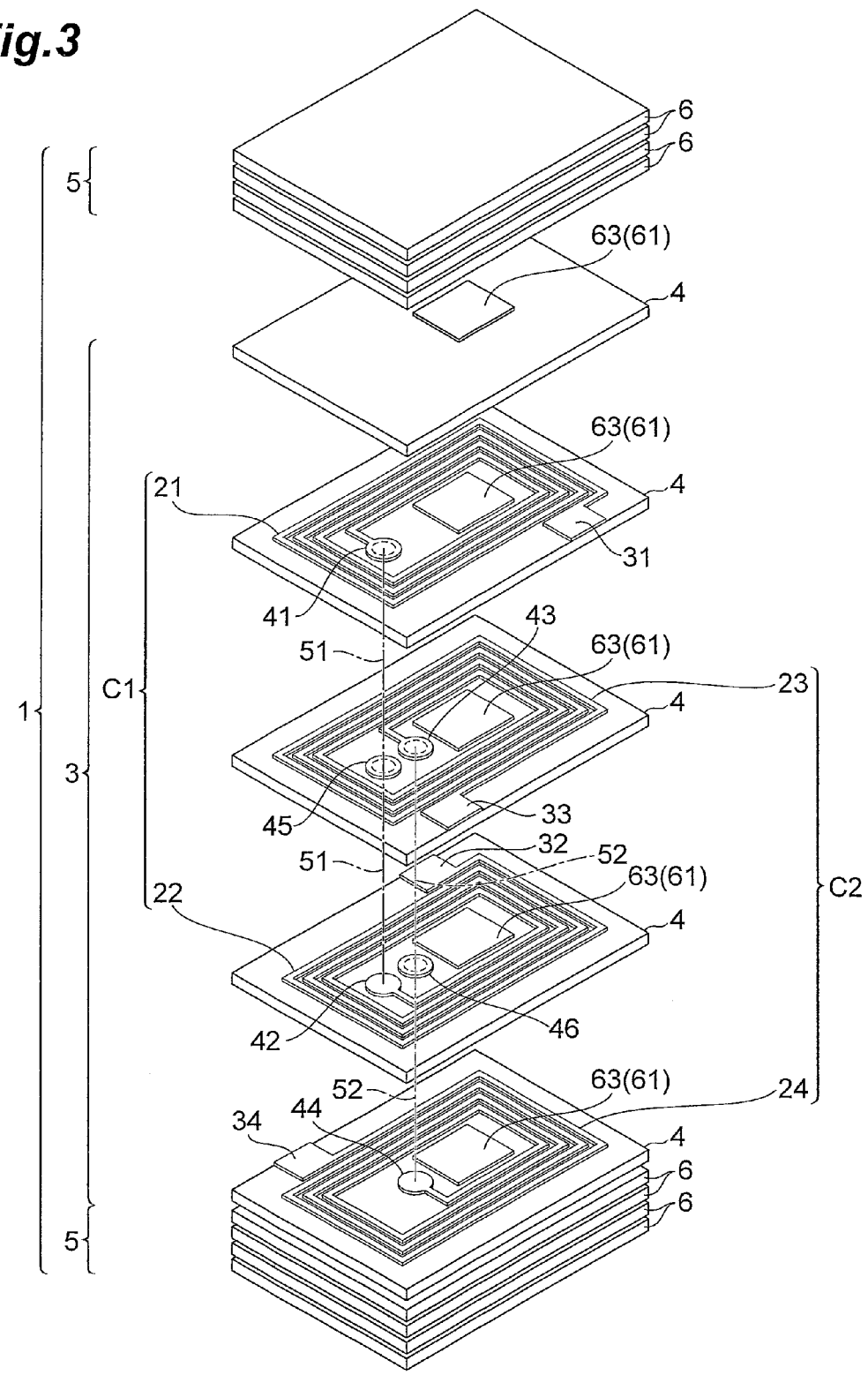
FIG. 3 is an exploded perspective view showing a configuration of the element body.

A configuration of a multilayer common mode filter CF according to an embodiment of the present invention will be described with reference to FIGS. 1 to 3. FIG. 1 is a perspective view showing the multilayer common mode filter according to the present embodiment. FIG. 2 is a drawing for explaining a cross-sectional configuration of an element body. FIG. 3 is an exploded perspective view showing a configuration of the element body.

The multilayer common mode filter CF, as shown in FIGS. 1 to 3, is provided with an element body 1 and with first to fourth terminal electrodes 11 to 14 arranged on the exterior surface of the element body 1. The element body 1 has a nonmagnetic section 3, and a pair of magnetic sections 5 arranged with the nonmagnetic section 3 in between in the height direction of the element body 1.

The element body 1 has a substantially rectangular parallelepiped shape. The element body 1 has, as its exterior surface, first and second principal faces 1a, 1b of a substantially rectangular shape opposed to each other, first and second side faces 1c, 1d opposed to each other, and third and fourth side faces 1e, 1f opposed to each other. The longitudinal direction of the element body 1 is a direction in which the third side face 1e and the fourth side face 1f are opposed to each other (this direction will be referred to hereinafter as the opposed direction of the third side face 1e and the fourth side face 1f). The width direction of the element body 1 is a direction in which the first side face 1c and the second side face 1d are opposed to each other (this direction will be referred to hereinafter as the opposed direction of the first side face 1c and the second side face 1d). The height direction of the element body 1 is a direction in which the first principal face 1a and the second principal face 1b are opposed to each other (this direction will be referred to hereinafter as the opposed direction of the first principal face 1a and the second principal face 1b).

The longitudinal length (L) of the element body 1 is set, for example, in the range of about 0.3 to 2.0 mm. The width length (W) of the element body 1 is set, for example, in the range of about 0.2 to 1.2 mm. The height length (H) of the element body 1 is set, for example, in the range of about 0.1 to 1.0 mm. The multilayer common mode filter CF is a low-profile multilayer common mode filter.

The first and second side faces 1c, 1d extend in the opposed direction of the first principal face 1a and the second principal face 1b so as to connect the first and second principal faces 1a, 1b. The first and second side faces 1c, 1d also extend in the opposed direction of the third side face 1e and the fourth side face 1f (the long-side direction of the first and second principal faces 1a, 1b). The third and fourth side faces 1e, 1f extend in the opposed direction of the first principal face 1a and the second principal face 1b so as to connect the first and second principal faces 1a, 1b. The third and fourth side faces 1e, 1f also extend in the opposed direction of the first side face 1c and the second side face 1d (the short-side direction of the first and second principal faces 1a, 1b).

The element body 1, as described above, has the nonmagnetic section 3 and the pair of magnetic sections 5. In the nonmagnetic section 3, as also shown in FIG. 3, a plurality of nonmagnetic layers 4 are laminated together. Namely, the nonmagnetic section 3 is composed of the plurality of laminated nonmagnetic layers 4. In the present embodiment, the nonmagnetic section 3 is composed of five nonmagnetic layers 4. In each of the magnetic sections 5, as also shown in FIG. 3, a plurality of magnetic layers 6 are laminated together. Namely, each magnetic section 5 is composed of the plurality of laminated magnetic layers 6.

Each nonmagnetic layer 4 is comprised, for example, of a sintered body of a ceramic green sheet containing a nonmagnetic material (e.g., a Cu—Zn ferrite material, dielectric material, or glass ceramic material). Each magnetic layer 6 is comprised, for example, of a sintered body of a ceramic green sheet containing a magnetic material (e.g., a Ni—Cu—Zn ferrite material, Ni—Cu—Zn—Mg ferrite material, or Ni—Cu ferrite material). In the actual element body 1, the nonmagnetic layers 4 and the magnetic layers 6 are integrated so that no boundary can be visually recognized between the layers. The height direction of the element body 1, i.e., the opposed direction of the first principal face 1a and the second principal face 1b coincides with the laminated direction of the plurality of nonmagnetic layers 4 and the laminated direction of the plurality of magnetic layers 6. The laminated direction of the plurality of nonmagnetic layers 4 and the laminated direction of the plurality of magnetic layers 6 will be referred to hereinafter simply as "laminated direction."

The first terminal electrode 11 and the third terminal electrode 13 are arranged on the first side face 1c side of the element body 1. The first terminal electrode 11 and the third terminal electrode 13 are formed up to some areas of the first and second principal faces 1a, 1b so as to cover a part of the first side face 1c along the opposed direction of the first and second principal faces 1a, 1b. The first terminal electrode 11 is located on the third side face 1e side. The third terminal electrode 13 is located on the fourth side face 1f side.

The second terminal electrode 12 and the fourth terminal electrode 14 are arranged on the second side face 1d side of the element body 1. The second terminal electrode 12 and the fourth terminal electrode 14 are formed up to some areas of the first and second principal faces 1a, 1b so as to cover a part of the second side face 1d along the opposed direction of the first and second principal faces 1a, 1b. The second terminal electrode 12 is located on the third side face 1e side. The fourth terminal electrode 14 is located on the fourth side face 1f side.

Each terminal electrode 11-14 contains an electroconductive element (e.g., Ag or Pd). Each terminal electrode 11-14 is configured as a sintered body of an electroconductive paste containing an electroconductive material (e.g., Ag powder or Pd powder). A plated layer is formed on the surface of each terminal electrode 11-14. The plated layer is formed, for example, by electroplating. The electroplating to be used herein is Cu plating, Ni plating, and Sn plating. The electroplating to be used herein may also be Ni plating and Sn plating.

The multilayer common mode filter CF, as shown in FIGS. 2 and 3, has a first coil conductor 21, a second coil conductor 22, a third coil conductor 23, a fourth coil conductor 24, a first lead conductor 31, a second lead conductor 32, a third lead conductor 33, and a fourth lead conductor 34 in the nonmagnetic section 3. Each conductor 21-24, 31-34 contains an electroconductive element (e.g., Ag or Pd). Each conductor 21-24, 31-34 is configured as a sintered body of an electroconductive paste containing an electroconductive material (e.g., Ag powder or Pd powder).

Figure 4:
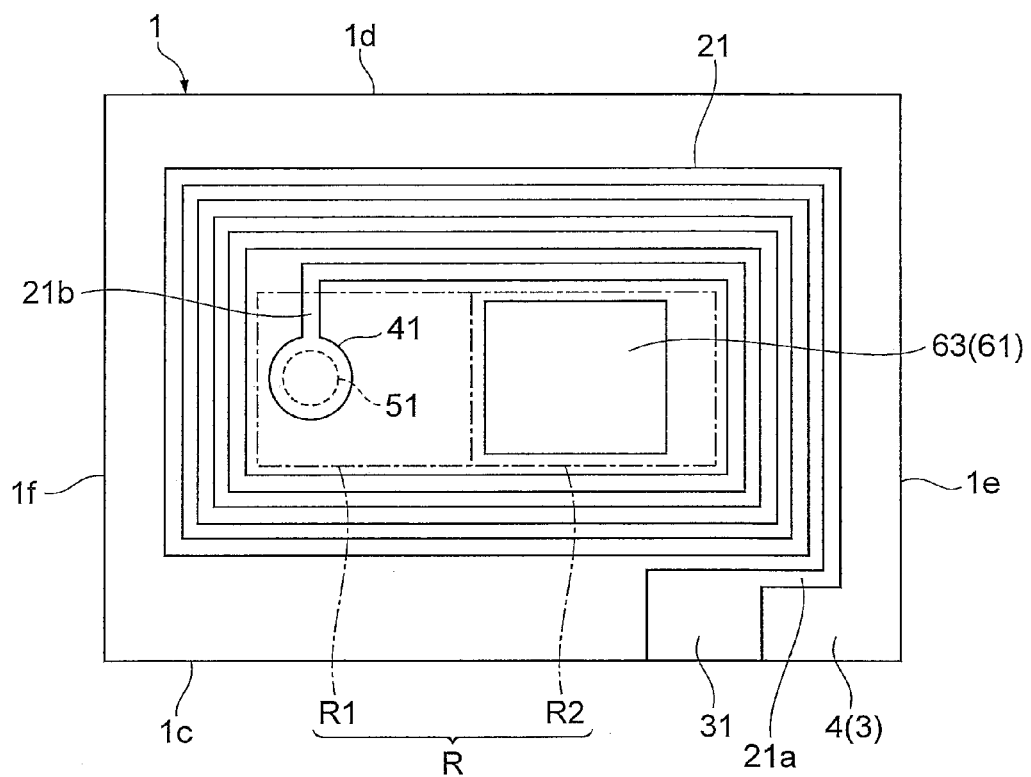
FIG. 4 is a plan view showing a first coil conductor.

The first coil conductor 21, as also shown in FIG. 4, has a spiral shape. The first coil conductor 21 is arranged between a pair of nonmagnetic layers 4 adjacent in the laminated direction. One end (outside end) 21a of the first coil conductor 21 is connected to the first lead conductor 31 located in the same layer as the first coil conductor 21. The first lead conductor 31 has an end exposed in the first side face 1c. The first lead conductor 31 is connected to the first terminal electrode 11, at the end exposed in the first side face 1c. The other end (inside end) 21b of the first coil conductor 21 is connected to a first pad conductor 41 located in the same layer as the first coil conductor 21.

Figure 5:
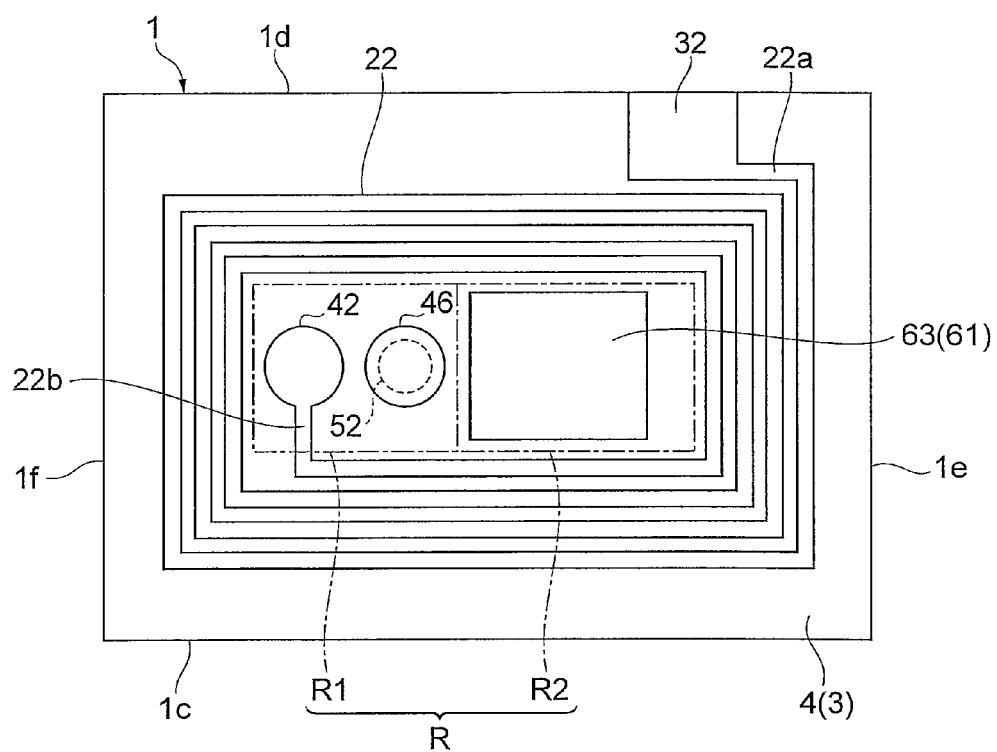
FIG. 5 is a plan view showing a second coil conductor.

The second coil conductor 22, as also shown in FIG. 5, has a spiral shape. The second coil conductor 22 is arranged between a pair of nonmagnetic layers 4 adjacent in the laminated direction. One end (outside end) 22a of the second coil conductor 22 is connected to the second lead conductor 32 located in the same layer as the second coil conductor 22. The second lead conductor 32 has an end exposed in the second side face 1d. The second lead conductor 32 is connected to the second terminal electrode 12, at the end exposed in the second side face 1d. The other end (inside end) 22b of the second coil conductor 22 is connected to a second pad conductor 42 located in the same layer as the second coil conductor 22.

Figure 6:
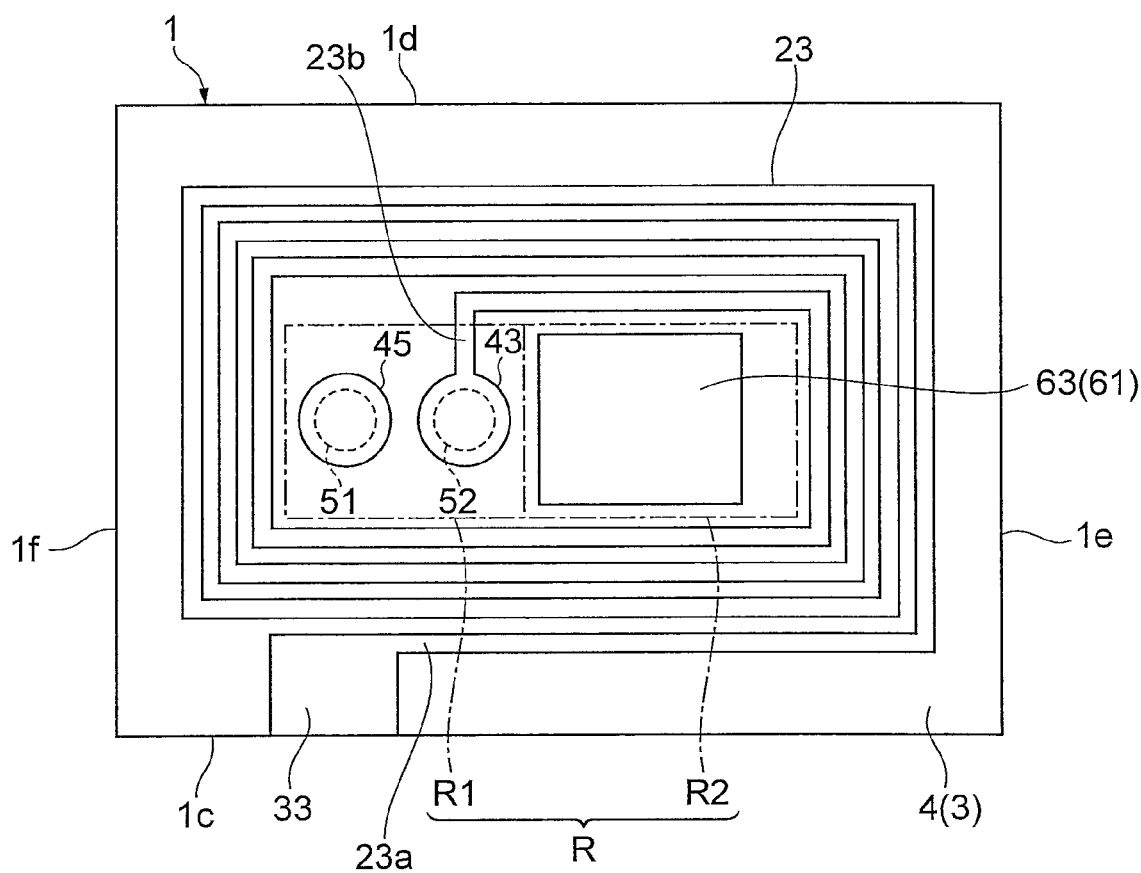
FIG. 6 is a plan view showing a third coil conductor.

The third coil conductor 23, as also shown in FIG. 6, has a spiral shape. The third coil conductor 23 is arranged between a pair of nonmagnetic layers 4 adjacent in the laminated direction. One end (outside end) 23a of the third coil conductor 23 is connected to the third lead conductor 33 located in the same layer as the third coil conductor 23. The third lead conductor 33 has an end exposed in the first side face 1c. The third lead conductor 33 is connected to the third terminal electrode 13, at the end exposed in the first side face 1c. The other end (inside end) 23b of the third coil conductor 23 is connected to a third pad conductor 43 located in the same layer as the third coil conductor 23.

Figure 7:
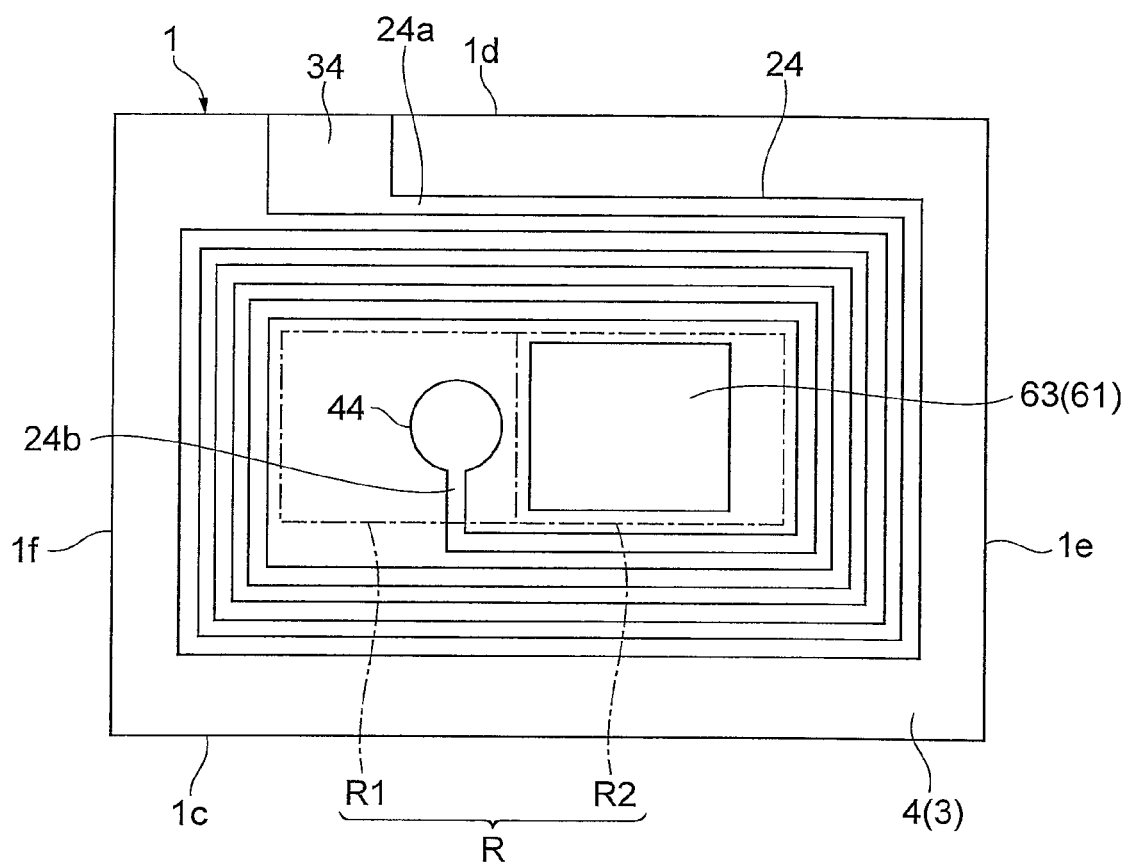
FIG. 7 is a plan view showing a fourth coil conductor.

The fourth coil conductor 24, as also shown in FIG. 7, has a spiral shape. The fourth coil conductor 24 is arranged between a pair of nonmagnetic layers 4 adjacent in the laminated direction. One end (outside end) 24a of the fourth coil conductor 24 is connected to the fourth lead conductor 34 located in the same layer as the fourth coil conductor 24. The fourth lead conductor 34 has an end exposed in the second side face 1d. The fourth lead conductor 34 is connected to the fourth terminal electrode 14, at the end exposed in the second side face 1d. The other end (inside end) 24b of the fourth coil conductor 24 is connected to a fourth pad conductor 44 located in the same layer as the first coil conductor 24.

The first coil conductor 21 and the third coil conductor 23 are adjacent to each other through the nonmagnetic layer 4 in the laminated direction. The third coil conductor 23 and the second coil conductor 22 are adjacent to each other through the nonmagnetic layer 4 in the laminated direction. The second coil conductor 22 and the fourth coil conductor 24 are adjacent to each other through the nonmagnetic layer 4 in the laminated direction. The first to fourth coil conductors 21-24 are arranged in the order of the first coil conductor 21, the third coil conductor 23, the second coil conductor 22, and the fourth coil conductor 24 in the laminated direction. The first to fourth coil conductors 21-24 are wound in the same direction and located so as to overlap each other when viewed from the laminated direction.

The first pad conductor 41 and the second pad conductor 42 are located so as to overlap each other, when viewed from the laminated direction. A fifth pad conductor 45 is arranged so as to overlap with the first and second pad conductors 41, 42, when viewed from the laminated direction, between the first pad conductor 41 and the second pad conductor 42. The first pad conductor 41 and the fifth pad conductor 45 are adjacent to each other through the nonmagnetic layer 4 in the laminated direction. The fifth pad conductor 45 and the second pad conductor 42 are adjacent to each other through the nonmagnetic layer 4 in the laminated direction. The fifth pad conductor 45 is located in the same layer as the third coil conductor 23.

The first pad conductor 41, the fifth pad conductor 45, and the second pad conductor 42 are connected each through a first through-hole conductor 51. The first through-hole conductor 51 penetrates the nonmagnetic layer 4 located between the first pad conductor 41 and the fifth pad conductor 45 and the nonmagnetic layer 4 located between the fifth pad conductor 45 and the second pad conductor 42.

The third pad conductor 43 and the fourth pad conductor 44 are located so as to overlap each other, when viewed from the laminated direction. A sixth pad conductor 46 is arranged so as to overlap with the third and fourth pad conductors 43, 44, when viewed from the laminated direction, between the third pad conductor 43 and the second pad conductor 44. The third pad conductor 43 and the sixth pad conductor 46 are adjacent to each other through the nonmagnetic layer 4 in the laminated direction. The sixth pad conductor 46 and the fourth pad conductor 44 are adjacent to each other through the nonmagnetic layer 4 in the laminated direction. The sixth pad conductor 46 is located in the same layer as the second coil conductor 22.

The third pad conductor 43, the sixth pad conductor 46, and the fourth pad conductor 44 are connected each through a second through-hole conductor 52. The second through-hole conductor 52 penetrates the nonmagnetic layer 4 located between the third pad conductor 43 and the sixth pad conductor 46 and the nonmagnetic layer 4 located between the sixth pad conductor 46 and the fourth pad conductor 44.

The first coil conductor 21 and the second coil conductor 22 are electrically connected through the first pad conductor 41, fifth pad conductor 45, second pad conductor 42, and first through-hole conductor 51. The first coil conductor 21 and the second coil conductor 22 constitute a first coil C1. The third coil conductor 23 and the fourth coil conductor 24 are electrically connected through the third pad conductor 43, sixth pad conductor 46, fourth pad conductor 44, and second through-hole conductor 52. The third coil conductor 23 and the fourth coil conductor 24 constitute a second coil C2. The multilayer common mode filter CF has the first coil C1 and the second coil C2 in the element body 1 (the nonmagnetic section 3). The first coil C1 and the second coil C2 are arranged in the nonmagnetic section 3 so that the first coil conductor 21 and the third coil conductor 23 are adjacent to each other in the laminated direction, so that the third coil conductor 23 and the second coil conductor 22 are adjacent to each other in the laminated direction, and so that the second coil conductor 22 and the fourth coil conductor 24 are adjacent to each other in the laminated direction.

The fifth and sixth pad conductors 45, 46 and the first and second through-hole conductors 51, 52 contain an electroconductive element (e.g., Ag or Pd). The fifth and sixth pad conductors 45, 46 and the first and second through-hole conductors 51, 52 are configured as sintered bodies of an electroconductive paste containing an electroconductive material (e.g., Ag powder or Pd powder). The first and second through-hole conductors 51, 52 are formed by sintering of the electroconductive paste filled in through holes formed in ceramic green sheets which are to constitute the corresponding nonmagnetic layers 4.

As shown in FIGS. 2 and 4 to 7, a portion R located inside the first coil C1 and the second coil C2 in the nonmagnetic section 3 includes a first regional portion R1 and a second regional portion R2 adjacent to each other when viewed from the laminated direction. The portion R located inside the first coil C1 and the second coil C2 in the nonmagnetic section 3 has a shape elongated in the longitudinal direction of the element body 1, when viewed from the laminated direction. The foregoing portion R has such a shape that the length in the opposed direction of the third side face 1e and the fourth side face 1f is longer than the length in the opposed direction of the first side face 1c and the second side face 1d, when viewed from the laminated direction.

The first through-hole conductor 51 and the second through-hole conductor 52 are located in the first regional portion R1 so as to be adjacent to each other, when viewed from the laminated direction. In the present embodiment, the first through-hole conductor 51 connected to the fifth pad conductor 45 and the second pad conductor 42 and the second through-hole conductor 52 connected to the third pad conductor 43 and the sixth pad conductor 46 are located so as to be adjacent to each other. The first through-hole conductor 51 and the second through-hole conductor 52, when viewed from the laminated direction, are located so as to be lined up along the longitudinal direction of the element body 1, or along the opposed direction of the third side face 1e and the fourth side face 1f. The first through-hole conductor 51 is located nearer to the fourth side face 1f than the second through-hole conductor 52 is.

The multilayer common mode filter CF, as shown in FIGS. 2 to 7, has a magnetic core section 61 in the nonmagnetic section 3. The magnetic core section 61 is composed of a plurality of magnetic layers 63 arranged so as to be adjacent to each other in the laminated direction. The magnetic layers 63 are arranged so as to overlap each other, when viewed from the laminated direction. The magnetic layers 63 are adjacent to each other through the nonmagnetic layer 4 in the laminated direction. The magnetic layers 63 and the nonmagnetic layers 4 are alternately located in the laminated direction in the magnetic core section 61.

In the present embodiment, each magnetic layer 63, except for the magnetic layer 63 located between one magnetic section 5 and the nonmagnetic section 3 (the magnetic layer 63 in contact with one magnetic section 5), is located in the same layer as each coil conductor 21-24. The magnetic core section 61 (magnetic layers 63) is located in the second regional portion R2 when viewed from the laminated direction. Each magnetic layer 63 has a rectangular shape when viewed from the laminated direction. Each magnetic layer 63 is composed, for example, of a sintered body of a ceramic green sheet containing a magnetic material (a Ni—Cu—Zn ferrite material, Ni—Cu—Zn—Mg ferrite material, or Ni—Cu ferrite material).

In the present embodiment, as described above, the portion R located inside the first coil C1 and the second coil C2 in the nonmagnetic section 3 includes the first regional portion R1 and the second regional portion R2. The first through-hole conductor 51 and the second through-hole conductor 52 are located in the first regional portion R1 so as to be adjacent to each other, when viewed from the laminated direction. The magnetic core section 61 is located in the second regional portion R2 when viewed from the laminated direction. As a consequence of these, the distance between the first through-hole conductor 51 and the second through-hole conductor 52 is short, whereby the first through-hole conductor 51 and the second through-hole conductor 52 are easy to be magnetically coupled. Therefore, the multilayer common mode filter CF can be configured with enhancement of magnetic coupling between the first coil C1 and the second coil C2.

When the first through-hole conductor 51 and the second through-hole conductor 52 are formed in an identical process, it is feasible to ensure extremely high positional accuracy of the first through-hole conductor 51 and positional accuracy of the second through-hole conductor 52. For this reason, it becomes feasible to set the distance between the first through-hole conductor 51 and the second through-hole conductor 52 much shorter. As a consequence of this, it is feasible to further enhance the magnetic coupling between the first coil C1 and the second coil C2.

The element body 1 has the substantially rectangular parallelepiped shape. The portion R located inside the first coil C1 and the second coil C2 in the nonmagnetic section 3 has the shape elongated in the longitudinal direction of the element body 1, when viewed from the laminated direction. The first through-hole conductor 51 and the second through-hole conductor 52 are located so as to be lined up along the longitudinal direction, when viewed from the laminated direction. These allow the first through-hole conductor 51 and the second through-hole conductor 52 to be arranged close together, while preventing a short circuit between each through-hole conductor 51, 52 and each coil conductor 21-24. As a consequence of this, it is feasible to further enhance the magnetic coupling between the first coil C1 and the second coil C2.

Since the first through-hole conductor 51 electrically connects the first coil conductor 21 and the second coil conductor 22 forming the first coil C1 and is located between the first coil conductor 21 and the second coil conductor 22, the first through-hole conductor 51 functions as a part of the first coil C1. Since the second through-hole conductor 52 electrically connects the third coil conductor 23 and the fourth coil conductor 24 forming the second coil C2 and is located between the third coil conductor 23 and the fourth coil conductor 24 as well, the second through-hole conductor 52 functions as a part of the second coil C2. Therefore, the first through-hole conductor 51 and the second through-hole conductor 52 are arranged close together, whereby they are magnetically coupled to each other. As a consequence of this, they effectively contribute to improvement in enhancement of the magnetic coupling between the first coil C1 and the second coil C2.

The element body 1 further has the pair of magnetic sections 5 arranged with the nonmagnetic section 3 in between in the laminated direction. This achieves further enhancement of the magnetic coupling between the first coil C1 and the second coil C2.

In the multilayer common mode filter CF, the second coil conductor 22 and the third coil conductor 23 are adjacent to each other in the laminated direction. This achieves magnetic coupling not only between the first coil conductor 21 and the third coil conductor 23 and between the second coil conductor 22 and the fourth coil conductor 24, but also between the second coil conductor 22 and the third coil conductor 23. As a consequence of this, it is feasible to further enhance the magnetic coupling between the first coil C1 and the second coil C2.

The above described the preferred embodiment of the present invention, and it should be noted that the present invention is not always limited to the above-described embodiment and can be modified in various ways without departing from the spirit and scope of the invention.

The first coil C1 is composed of the two coil conductors 21, 22 and the second coil C2 is composed of the two coil conductors 23, 24; however, they do not always have to be limited to this configuration. For example, each coil C1, C2 may be composed of three or more coil conductors. The shape of each coil conductor 21-24 does not have to be limited to the illustrated one.

The first through-hole conductor 51 and the second through-hole conductor 52 are located so as to be lined up along the longitudinal direction of the element body 1, when viewed from the laminated direction, but they do not always have to be limited to this configuration. For example, the first through-hole conductor 51 and the second through-hole conductor 52 may be located so as to be lined up along a direction intersecting with the opposed direction of the first side face 1c and the second side face 1d and the opposed direction of the third side face 1e and the fourth side face 1f, when viewed from the laminated direction.

The magnetic core section 61 is composed of the plurality of magnetic layers 63 arranged through the nonmagnetic layer 4 in the laminated direction, but it does not always have to be limited to this configuration. For example, the magnetic core section 61 may be composed of a plurality of magnetic layers 63 arranged continuously without intervention of the nonmagnetic layer 4 in the laminated direction. Each magnetic layer 63 has the rectangular shape, when viewed from the laminated direction, but it does not always have to be limited to this shape. For example, each magnetic layer 63 may have a circular shape or any polygonal shape other than the rectangular shape, when viewed from the laminated direction.

The portion R located inside the first coil C1 and the second coil C2 in the nonmagnetic section 3 has the shape elongated in the longitudinal direction of the element body 1, when viewed from the laminated direction, but it does not always have to be limited to this shape. The portion R may have such a shape that the length in the opposed direction of the first side face 1c and the second side face 1d is equal to the length in the opposed direction of the third side face 1e and the fourth side face 1f, when viewed from the laminated direction.

The first coil C1 and the second coil C2 are arranged in the nonmagnetic section 3 so that the second coil conductor 22 and the third coil conductor 23 are adjacent to each other in the laminated direction, but they do not always have to be limited to this configuration. For example, the first coil C1 and the second coil C2 may be arranged in the nonmagnetic section 3 so that the third coil conductor 23 and the fourth coil conductor 24 are adjacent to each other in the laminated direction.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multilayer common mode filter comprising:
   an element body having a nonmagnetic section in which a plurality of nonmagnetic layers are laminated together;
   a first coil having first and second coil conductors of a spiral shape and configured in such a structure that the first coil conductor and the second coil conductor are connected by a first through-hole conductor;
   a second coil having third and fourth coil conductors of a spiral shape and configured in such a structure that the third coil conductor and the fourth coil conductor are connected by a second through-hole conductor; and
   a magnetic core section arranged in the nonmagnetic section so as to be located inside the first coil and the second coil when viewed from a laminated direction of the plurality of nonmagnetic layers, and comprised of a magnetic material,
   wherein the first coil and the second coil are arranged in the nonmagnetic section so that the first coil conductor and the third coil conductor are adjacent to each other in the laminated direction and so that the second coil conductor and the fourth coil conductor are adjacent to each other in the laminated direction,
   wherein a portion located inside the first coil and the second coil in the nonmagnetic section includes a first regional portion and a second regional portion adjacent to each other when viewed from the laminated direction,
   wherein the first through-hole conductor and the second through-hole conductor are located in the first regional portion so as to be adjacent to each other, when viewed from the laminated direction, and
   wherein the magnetic core section is located in the second regional portion when viewed from the laminated direction.

2. The multilayer common mode filter according to claim 1,
   wherein the element body has a substantially rectangular parallelepiped shape,
   wherein the portion located inside the first coil and the second coil in the nonmagnetic section has a shape elongated in a longitudinal direction of the element body when viewed from the laminated direction, and
   wherein the first through-hole conductor and the second through-hole conductor are located so as to be lined up along the longitudinal direction, when viewed from the laminated direction.

3. The multilayer common mode filter according to claim 1,
   wherein the element body further has a pair of magnetic sections comprised of a magnetic material and arranged with the nonmagnetic section in between in the laminated direction.

4. The multilayer common mode filter according to claim 1,
   wherein the first coil and the second coil are arranged in the nonmagnetic section further so that the second coil conductor and the third coil conductor are adjacent to each other in the laminated direction.

* * * * *